United States Patent
Sumida

(10) Patent No.: US 6,690,582 B2
(45) Date of Patent: Feb. 10, 2004

(54) ELECTRONIC CONTROL UNIT MOUNTING STRUCTURE

(75) Inventor: Yoshitaka Sumida, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 09/912,295

(22) Filed: Jul. 26, 2001

(65) Prior Publication Data

US 2002/0022387 A1 Feb. 21, 2002

(30) Foreign Application Priority Data

Aug. 9, 2000 (JP) ...................................... P2000-241227

(51) Int. Cl.[7] .............................. H05K 5/00; H05K 5/04; H05K 5/06
(52) U.S. Cl. ..................... 361/752; 361/735; 361/790; 361/803; 361/785; 361/791; 439/76.2; 439/65; 439/74
(58) Field of Search ................................ 361/752, 735, 361/790, 760, 728, 783, 785, 803, 804, 820, 791, 742, 758, 764, 825; 439/76.2, 65, 74

(56) References Cited

U.S. PATENT DOCUMENTS

| | | | |
|---|---|---|---|
| 5,040,994 A | * | 8/1991 | Nakamoto et al. ............. 439/76 |
| 5,157,588 A | * | 10/1992 | Kim et al. ................... 361/396 |
| 5,461,542 A | * | 10/1995 | Kosak et al. ................ 361/710 |
| 5,469,335 A | * | 11/1995 | Kluth et al. ................. 361/800 |
| 5,478,244 A | | 12/1995 | Maue et al. |
| 5,501,003 A | * | 3/1996 | Bernstein ...................... 29/827 |
| 5,699,235 A | * | 12/1997 | Tsurumiya et al. ......... 361/803 |
| 5,801,925 A | | 9/1998 | Boada Fonts |
| 5,882,213 A | | 3/1999 | Witek et al. |
| 6,031,730 A | * | 2/2000 | Kroske ........................ 361/784 |
| 6,049,467 A | * | 4/2000 | Tamarkin et al. ........... 361/790 |
| 6,144,571 A | * | 11/2000 | Sasaki et al. ................ 363/144 |
| 6,283,769 B1 | * | 9/2001 | Asao et al. ................. 439/76.2 |
| 6,341,066 B1 | * | 1/2002 | Murowaki et al. .......... 361/707 |
| 6,421,244 B1 | * | 7/2002 | Shinohara et al. .......... 361/736 |

FOREIGN PATENT DOCUMENTS

| | | |
|---|---|---|
| DE | 19 62 067 U | 6/1967 |
| EP | 0 584 902 A1 | 3/1994 |
| JP | 10-190256 A | 7/1998 |

* cited by examiner

Primary Examiner—David Martin
Assistant Examiner—Thanh Yen Tran
(74) Attorney, Agent, or Firm—Oliff & Berridge, PLC

(57) ABSTRACT

In an electronic control unit mounting structure, electronic control units are mounted on a junction block, and printed circuit boards 4a and 4b of the electronic control units, each having a connector 41a, 41b of a through construction mounted thereon, are superposed in such a posture that these connectors 41a and 41b are disposed in registry with each other in an upward-downward direction, and connection terminals 31 of the junction block are inserted in the connectors 41a and 41b.

17 Claims, 14 Drawing Sheets

FIG. 8

| 4a | 4b | | |
|---|---|---|---|
| O | O | +B | 1 |
| O | O | ACC | 2 |
| O | O | IG | 3 |
| O | O | DOOR | 4 |
| O | O | KEY | 5 |
| O |   | LOCK | 6 |
| O |   | UNLOCK | 7 |
|   | O | LIGHT | 8 |
| O | O | EARTH | 9 |
| O |   | LOCK MOTOR | 10 |
| O |   | UNLOCK MOTOR | 11 |

ELECTRONIC CONTROL UNIT MOUNTING STRUCTURE

BACKGROUND OF THE INVENTION

1. Field of the Invention

This invention relates to a structure of mounting electronic control units, used, for example, in a vehicle, on a junction block.

2. Description of the Related Art

Usually, only one electronic control unit was mounted on a junction block (electric connection box), and when a power source and a ground wire, a switch signal wire, a motor signal wire or the like, which were required for the electronic control unit, were wired within the junction block, these were mounted in an integrated manner.

FIG. 14 is an exploded perspective view of one conventional electronic control unit mounting structure, and FIG. 15 is a cross-sectional view of the electronic control unit mounting structure in its assembled condition.

A junction block includes wiring members, such as a stacked bus bar 3, mounted between an upper casing 2 and a lower casing 1. A printed circuit board 4 of the electronic control unit, having a plurality of electronic parts 42 (FIG. 15) mounted thereon, is mounted above the stacked bus bar, and further a case portion 5 is mounted on the printed circuit board 4.

Upstanding male terminals (tab terminals) 31, serving as connection terminals for transmitting signals necessary for the electronic control unit, are provided for connecting the printed circuit board 4 of the electronic control unit to the stacked bus bar 3 of the junction block. These male terminals extend through the printed circuit board 4 of the electronic control unit, and are inserted into a connector 41, mounted on the obverse surface of this printed circuit board, so that the printed circuit board 4 of the electronic control unit is electrically connected to the stacked bus bar 3 of the junction block.

Although a plurality of electronic control units were mounted on a vehicle, one electronic control unit was usually mounted on a junction block, and therefore it was necessary to mount the other electric control units separately from the junction block.

However, when the other electronic control units, which can not be mounted on the junction block, are mounted separately from this junction block, there is needed wire harnesses for connecting these separate electronic control units to the junction block, and therefore the weight of the vehicle increases, and also the cost increases.

And besides, there are optional vehicle electronic control units which are mounted in accordance with the grade and the specification, and for mounting these optional units, it was necessary to prepare wire harnesses for these optional units.

SUMMARY OF THE INVENTION

This invention has been made in order to solve the above problems of the prior art, and an object of the invention is to provide an electronic control unit mounting structure in which even when a plurality of electronic control units are to be mounted, it is not necessary to use wire harnesses for connecting these electronic control units to a junction block, thereby reducing the weight of a vehicle and the cost.

To achieve the above object, according to the present invention, there is provided a electronic control unit mounting structure wherein electronic control units are mounted on a junction block; characterized in that the plurality of electronic control units, each having a connector of a through construction mounted thereon, are superposed in such a posture that the connectors are disposed in registry with each other in an upward-downward direction, and connection terminals of the junction block are inserted in the connectors.

In this construction, the plurality of electronic control units, each having the connector of the through construction mounted thereon, are superposed in such a posture that the connectors are disposed in registry with each other in the upward-downward direction, and in this condition the connection terminals of the junction block are inserted in the connectors. Therefore, even when the plurality of electronic control units are mounted, there is no need to provide a wire harness for connecting each electronic control unit to the junction block since the electronic control units are integrated with the junction block.

In one aspect of the invention, obverse surfaces of the electronic control units face in the same direction. With this arrangement, even when the plurality of electronic control units are mounted, each electronic control unit does not need to be changed in posture, and therefore the assemblage is simplified.

In another aspect of the invention, the directions of obverse surfaces of the adjacent electronic control units are reverse to each other. With this arrangement, even when the plurality of electronic control units are mounted, the length of the terminals of the junction block is reduced since the connectors of the adjacent electronic control units face each other, and therefore the production of the terminals is simplified.

In the invention, preferably, spacers are interposed between the adjacent electronic control units. With this construction, the electronic control units can be easily kept in the predetermined posture, and therefore the assemblage is simplified.

In the invention, at least one of the electronic control units is selected from a plurality of prepared electronic control units. In this case, the optional specification can be easily met with.

BRIEF DESCRIPTION OF THE DRAWINGS

FIG. 8 is a diagram showing one example of a terminal arrangement.

DETAILED DESCRIPTION OF THE PREFERRED EMBODIMENTS

Figure 1:
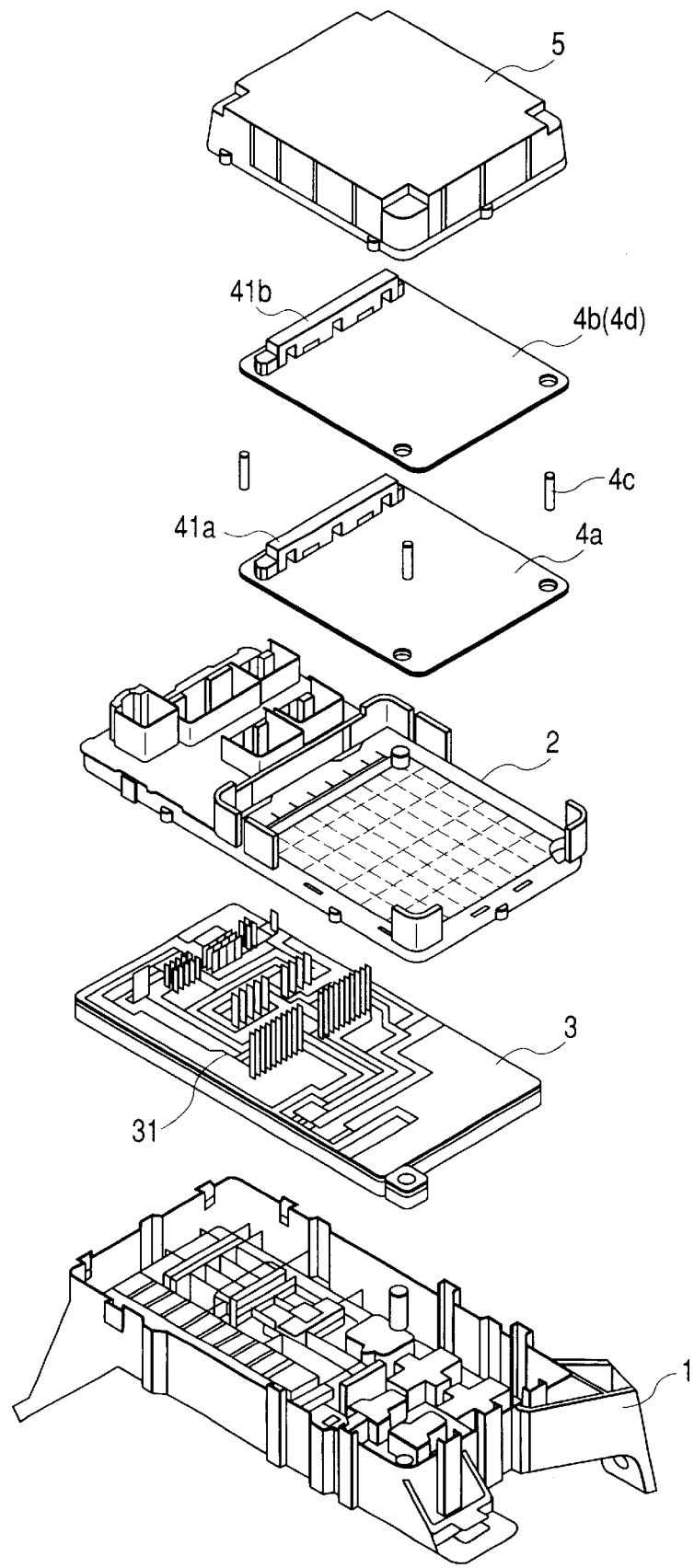
FIG. 1 is an exploded, perspective view of an electronic control unit mounting structure of a first embodiment.

Several embodiments of the present invention will now be described in detail with reference to the drawings, and those portions, identical in construction and operation to those of the conventional structure, will be designated by identical reference numerals, respectively, and detailed explanation thereof will be omitted.

First Embodiment

Figure 2:
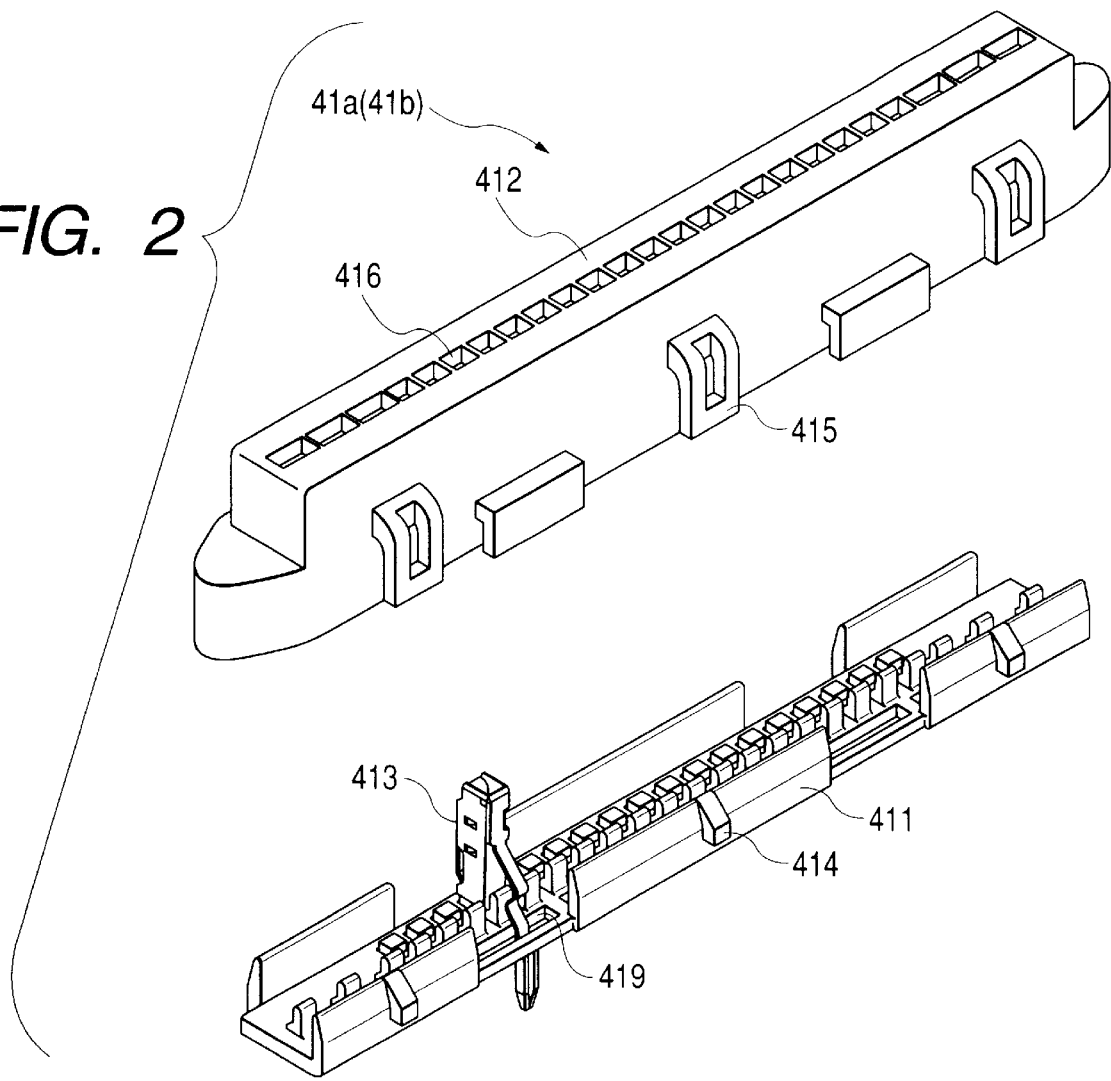
FIG. 2 is an exploded, perspective view of a connector.
Figure 3:
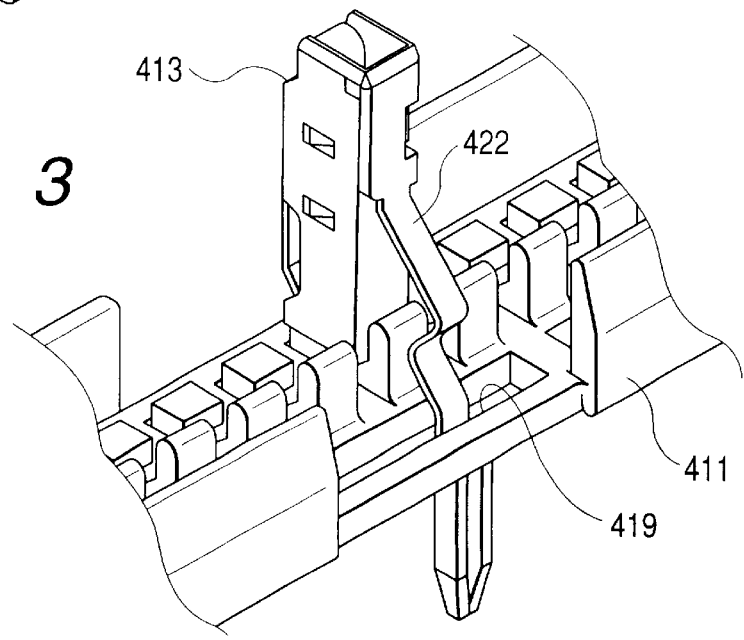
FIG. 3 is an enlarged view of a portion of the connector of FIG. 2.
Figure 4:
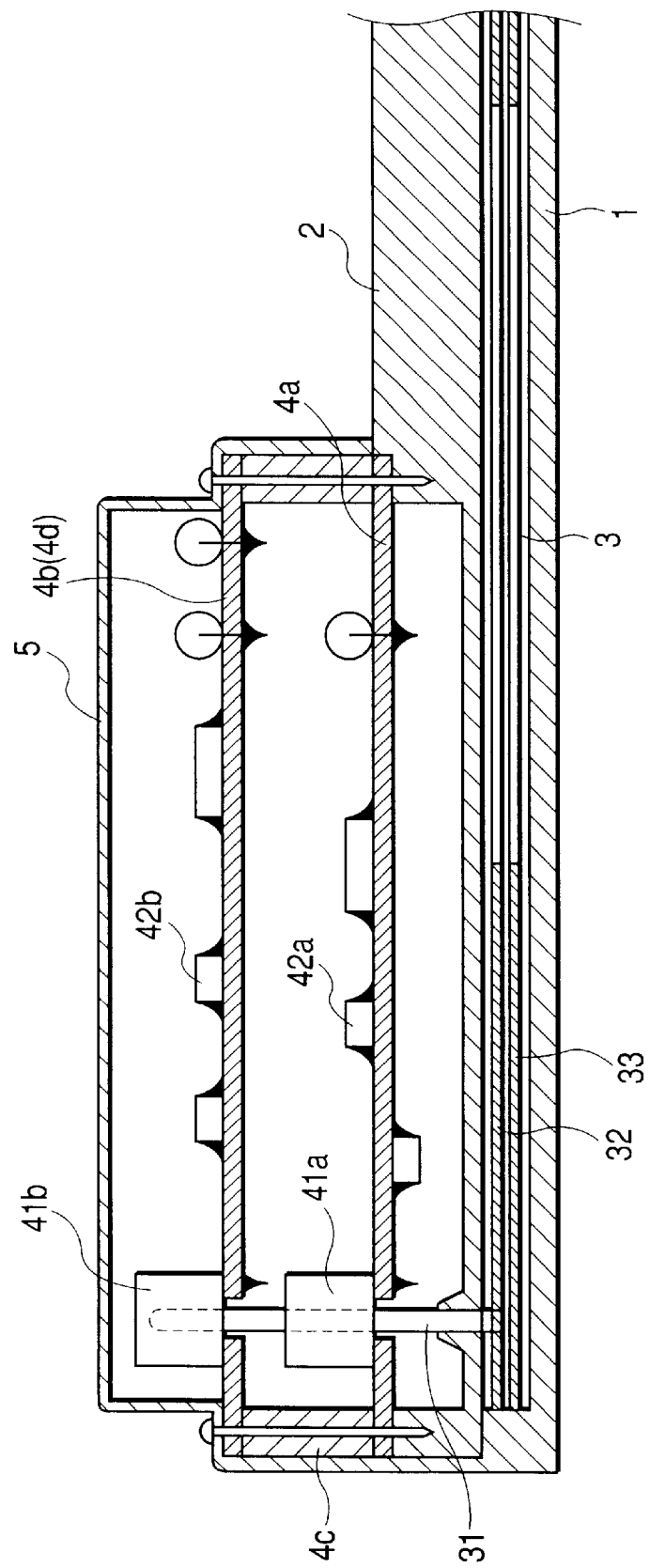
FIG. 4 is a cross-sectional view showing the electronic control unit mounting structure of the first embodiment in its assembled condition.
Figure 5:
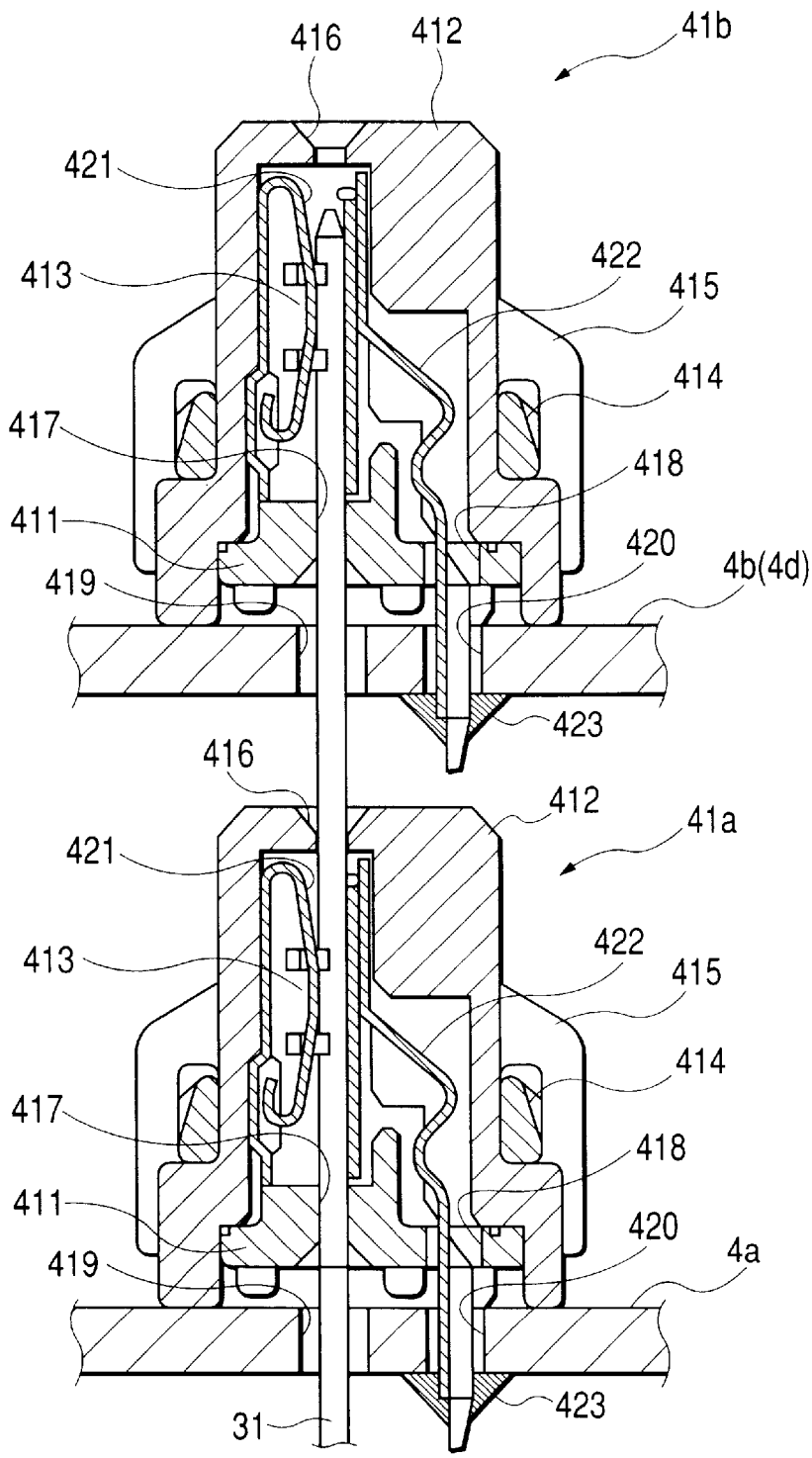
FIG. 5 is an enlarged, cross-sectional view of connector portions of FIG. 4.

FIG. 1 is an exploded, perspective view of an electronic control unit mounting structure of a first embodiment, FIG. 2 is an exploded, perspective view of a connector, FIG. 3 is an enlarged view of a portion of the connector, FIG. 4 is a cross-sectional view showing the electronic control unit mounting structure in its assembled condition, and FIG. 5 is an enlarged, cross-sectional view of connector portions of this structure.

As shown in FIG. 1, in the electronic control unit mounting structure of this first embodiment, printed circuit boards 4a and 4b of two electronic control units, each having a connector 41a, 41b of a through construction mounted thereon, are superposed together in such a posture that the connectors 41a and 41b are disposed in registry with each other in an upward-downward direction, and male terminals (tab terminals) 31, serving as connection terminals of a junction block, are inserted in the connectors 41a and 41b. Here, the printed circuit boards 4a and 4b are mounted on the junction block in such a manner that the two boards 4a and 4b are superposed together, with their obverse surfaces facing in the same direction.

The junction block is of such a structure that wiring members, such as a stacked bus bar 3, are mounted between an upper casing 1 and a lower casing 2. The printed circuit boards 4a and 4b of the electronic control units, each having a plurality of electronic parts 42a and 42b (FIG. 4) mounted thereon, are mounted above the stacked bus bar, and further a case portion 5 is mounted on the printed circuit boards 4a and 4b. Spacers 4c are provided between the printed circuit boards 4a and 4b at suitable regions to space them a predetermined distance from each other.

The stacked bus bar 3 comprises a plurality of bus bars 32, and an insulating layer 33 is interposed between any two adjacent bus bars 32. The tab terminals 31 are formed on and extend upright from the predetermined bus bars 32, respectively (FIG. 4). Although the tab terminal 31, shown in the drawings, has such a length that it extends into the upper connector 41b, some of the tab terminals 31 have such a length that they terminate within the lower connector 41a.

The connectors 41a and 41b have the same construction, and have an elongate shape, and are mounted respectively on one end portions of the printed circuit boards 4a and 4b substantially over an entire width thereof. Therefore, corresponding elements of the connectors 4a and 4b will be designated by identical reference numerals, and will be described collectively.

In the connector 41a, 41b, female metal members 413 are received in predetermined regions between a base member 411 and a cover member 412 as shown in FIGS. 2 and 3, and projections 414, formed at predetermined portions of the base member 411, are engaged respectively with claws 415, formed on the cover member 412, so that the two elements are combined together in a unitary manner, and in this condition the connectors 41a and 41b are fixedly mounted on the printed circuit boards 4a and 4b, respectively. The female metal member 413 has a through construction, and the tab terminal 33 and others can extend through or can be inserted into the female metal member 413 through a through hole 416, formed in the cover member 412, through holes 417 and 418 (FIG. 5), formed in the base member 411, and through holes 419 and 420 (FIG. 5), formed in the printed circuit board 4a, 4b.

In this first embodiment, the connectors 41a and 41b are mounted on the obverse surfaces (upper surfaces) of the printed circuit boards 4a and 4b, respectively, and an enlarged cross-section of portions of these connectors is shown in FIG. 5. Here, the female metal member 413 is formed by bending an electrically-conductive metal sheet into a square tubular shape, and an upper end portion thereof is folded back inwardly to form a spring tongue 421. A connection piece portion 422 extends from that outer surface of the female metal terminal 413 facing away from the spring tongue 421, and this connection piece portion 422 is soldered (as at 423) to a printed wiring (not shown) formed on the printed circuit board 4a, 4b.

When the printed circuit board 4a is mounted, each tab terminal 31 extends through this printed circuit board 4a and the connector 41a, and at this time the spring tongue 421 contacts this tab terminal 31, and therefore the stacked bus bar 3 is electrically connected to the printed wiring of the printed circuit board 4a through the tab terminal 31, the spring tongue 421 and the extension piece portion 422 of the female metal member 413.

Then, when the printed circuit board 4b is mounted in superposed relation to the printed circuit board 4a, the tab terminal 31 is inserted into the connector 41b, and at this time the spring tongue 421 contacts this tab terminal 31, and therefore the stacked bus bar 3 is electrically connected to the printed wiring of the printed circuit board 4b through the tab terminal 31, the spring tongue 421 and the extension piece portion 422 of the female metal member 413. The thus assembled condition is shown in FIG. 4.

Figure 6:
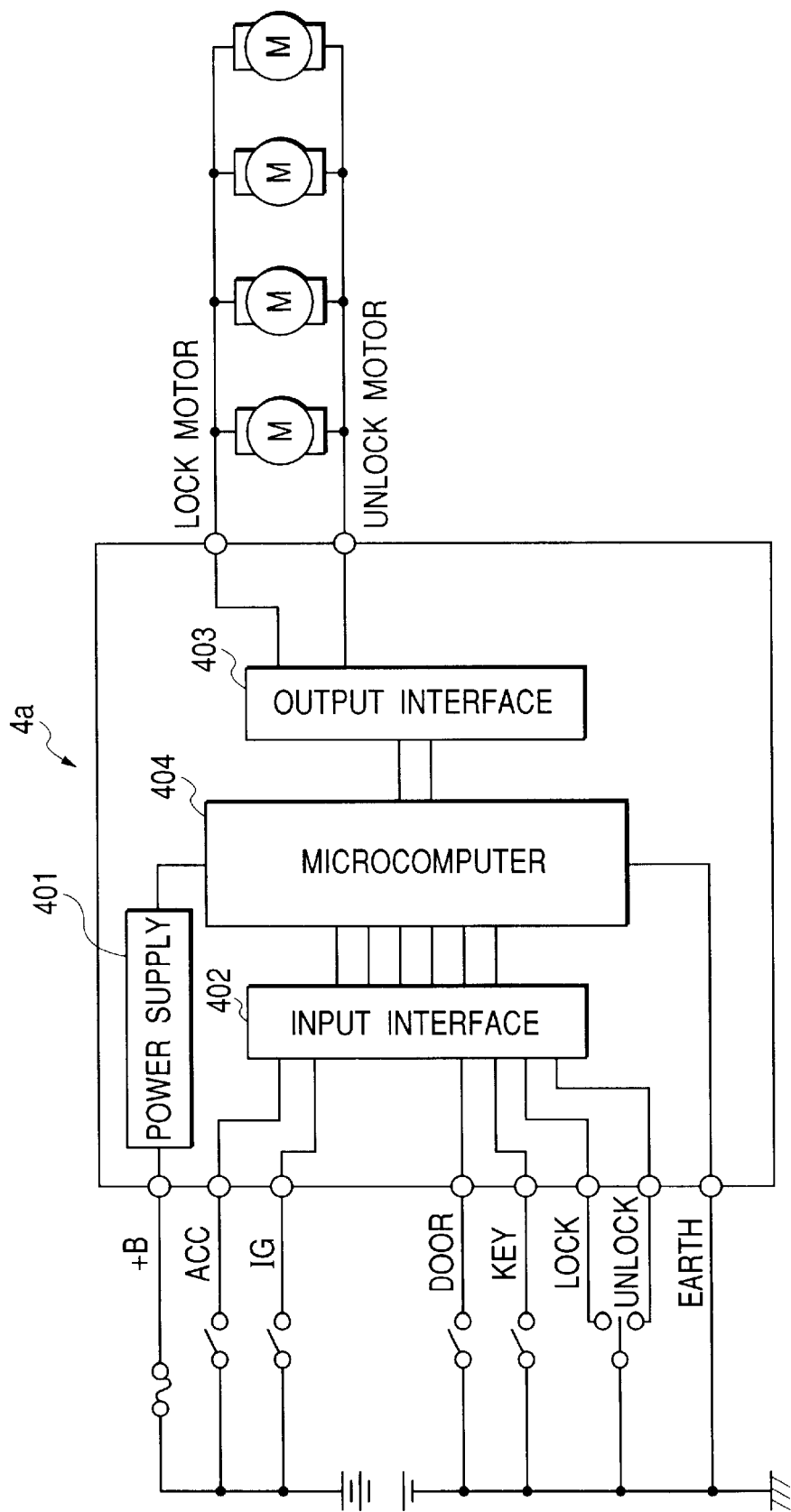
FIG. 6 is a block diagram of a printed circuit board of a door lock control unit.
Figure 7:
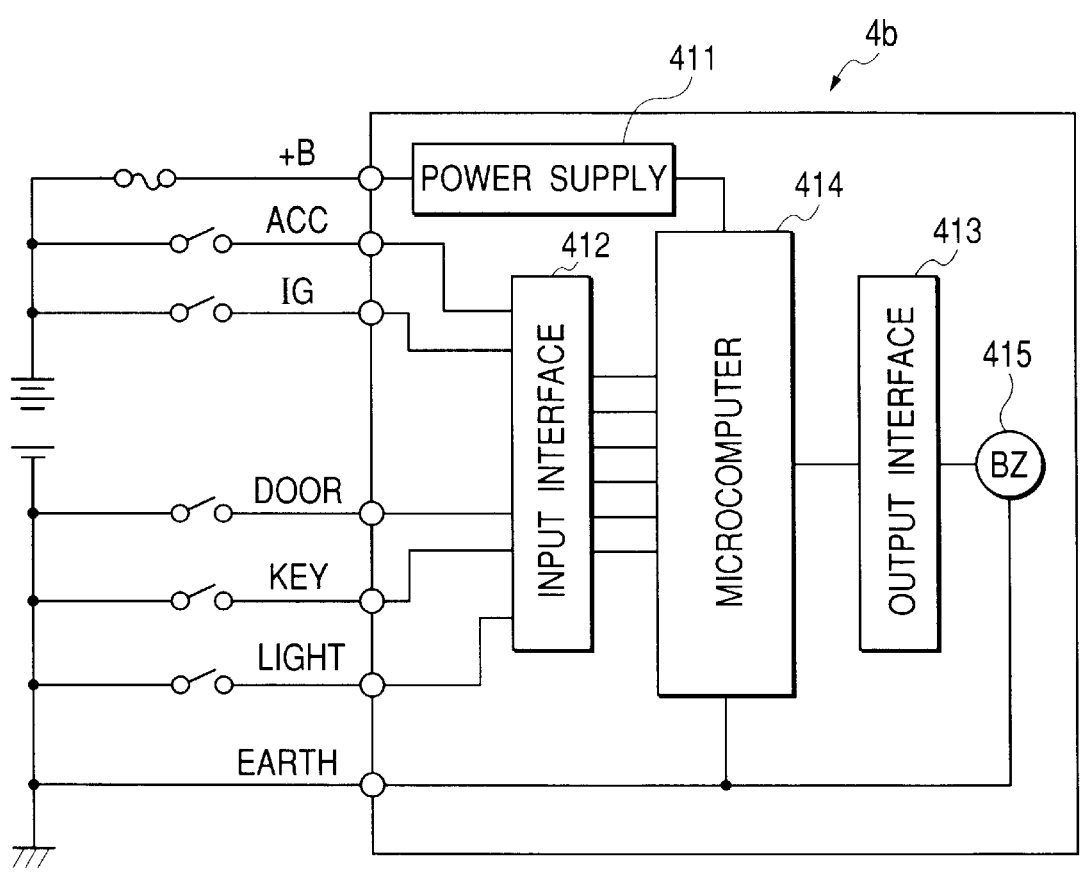
FIG. 7 is a block diagram of a printed circuit board of an alarm buzzer control unit.

Description will be further made with reference to FIGS. 6, 7 and 8. FIGS. 6 and 7 are block diagrams of the printed circuit boards, respectively, and FIG. 8 is a diagram showing one example of a terminal arrangement. Here, the printed circuit board 4a serves as a door lock control unit, and the printed circuit board 4b serves as an alarm buzzer control unit.

The door lock control unit 4a includes a power source portion 401 adapted to be connected to a battery (+B), an input interface 402, which is adapted to be connected to an accessory (ACC) of an ignition switch necessary for the control, an ON-signal (IG) of the ignition switch, a key switch (key) for detecting the insertion/withdrawal of a ignition key, a door switch (door) for detecting the opening/closing of a door, and a lock switch (lock, unlock) for detecting the locking and unlocking of a door lock, an output interface 403 adapted to be connected to a lock motor output (lock motor) for driving door lock motors and to an unlock motor output (unlock motor), and a microcomputer 404 connected to the above elements 401 to 403 and an earth.

On the other hand, the alarm buzzer control unit 4b includes a power source portion 411 adapted to be connected to the battery (+B), an input interface 412, which is adapted to be connected to the accessory (ACC) of the ignition switch necessary for the control, the ON-signal (IG) of the ignition switch, the key switch (key) for detecting the insertion/withdrawal of the ignition key, the door switch (door) for detecting the opening/closing of the door, and a light switch (light) for controlling the turning-on/off of headlamps, a buzzer 415 adapted to be connected to the earth, an output interface 413 connected to this buzzer 415, and a microcomputer 414 connected to the above elements 411 to 413 and the earth. Usually, the buzzer 415 is mounted on the printed circuit board 4b, and therefore there is no need to provide any circuit for outputting the relevant signal from the printed circuit board 4b.

As described above, the upstanding signal tab terminals 31 for connecting the printed circuit boards 4a and 4b together are provided on the junction block. In the assembling process in which the two electronic control units are mounted on the junction block, the printed circuit board 4a is first inserted in a predetermined position, and then the printed circuit board 4b is mounted in such a manner that the same tab terminals 31 are inserted through the printed circuit board 4b in the same direction as described for the first printed circuit board 4a. Here, the terminal arrangements of the printed circuit boards 4a and 4b need to be the same at the common signal portions, but the terminal arrangement can be easily changed in a pattern design of a printed circuit board, and therefore this will not be a large limitation from the viewpoint of the design.

Reference numerals 1 to 11 on the printed circuit boards 4a and 4b in FIG. 8 denote plane positions in which the terminals can be provided, and the two boards 4a and 4b and the kinds of the terminals are shown in a matrix-like manner in left columns in such a manner that these correspond to the plane positions.

Mark O in the matrix indicates the presence of the terminal on the boards 4a and 4b, and the absence of this mark indicates the absence of the terminal. Therefore, if the stacked bus bar 3 is the signal circuit common to the printed circuit boards 4a and 4b, the number of the tab terminals 31, as well as and the number of the female metal members 413 of the connectors 41a and 41b, is reduced, and the more efficient mounting can be achieved.

As described above, in this first embodiment, even when the plurality of electronic control units are mounted, there is no need to provide a wire harness for connecting each electronic control unit to the junction block, and therefore the weight of the vehicle and the cost can be reduced. And besides, even when the plurality of electronic control units are mounted, the posture of the electronic control units is not changed, and therefore the assemblage is relatively easy. Furthermore, the electronic control units can be easily kept in the predetermined posture relative to each other by the spacers, and therefore the assemblage is simpler.

Second Embodiment

Figure 9:
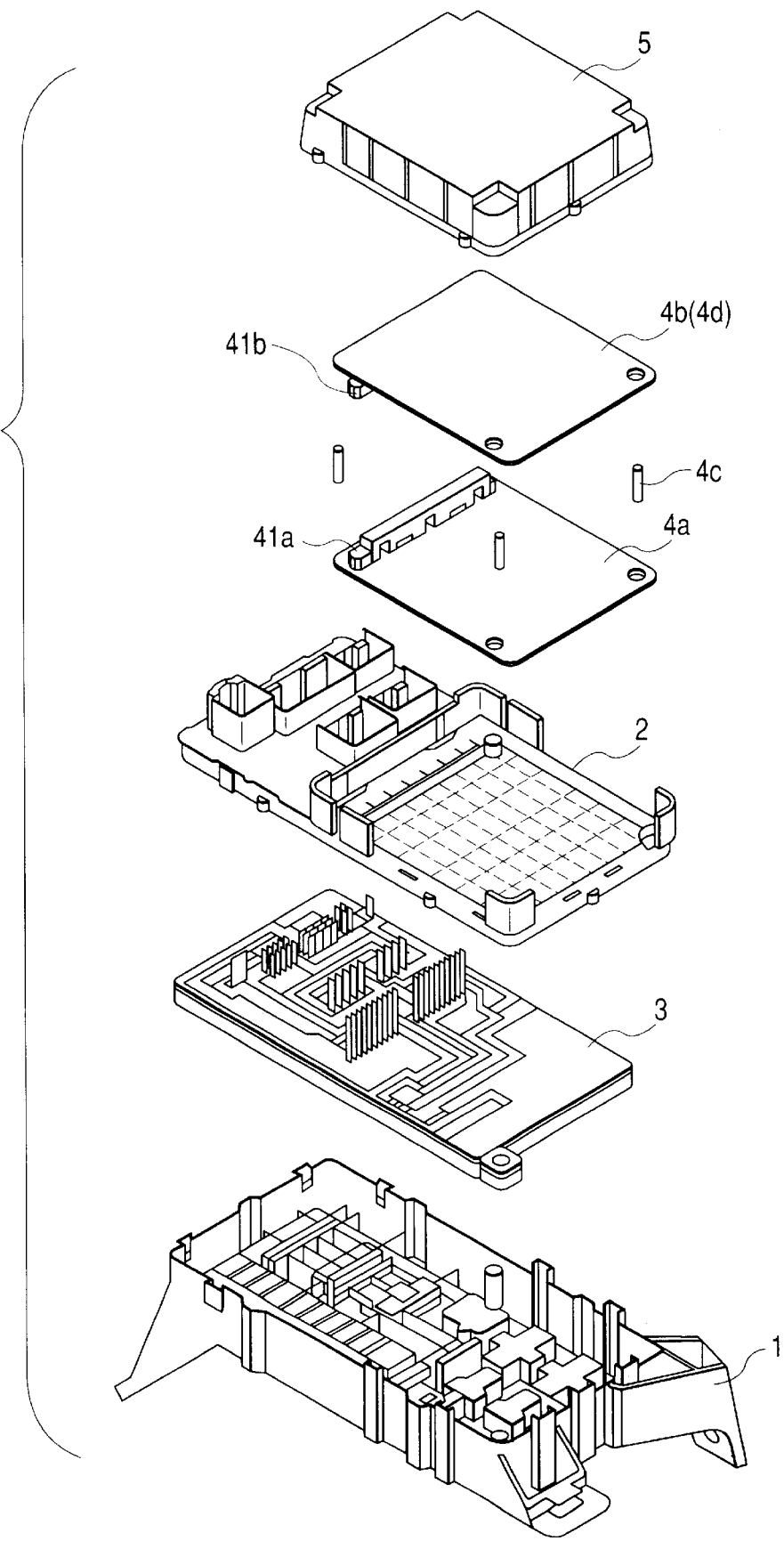
FIG. 9 is an exploded, perspective view of an electronic control unit mounting structure of a second embodiment.
Figure 10:
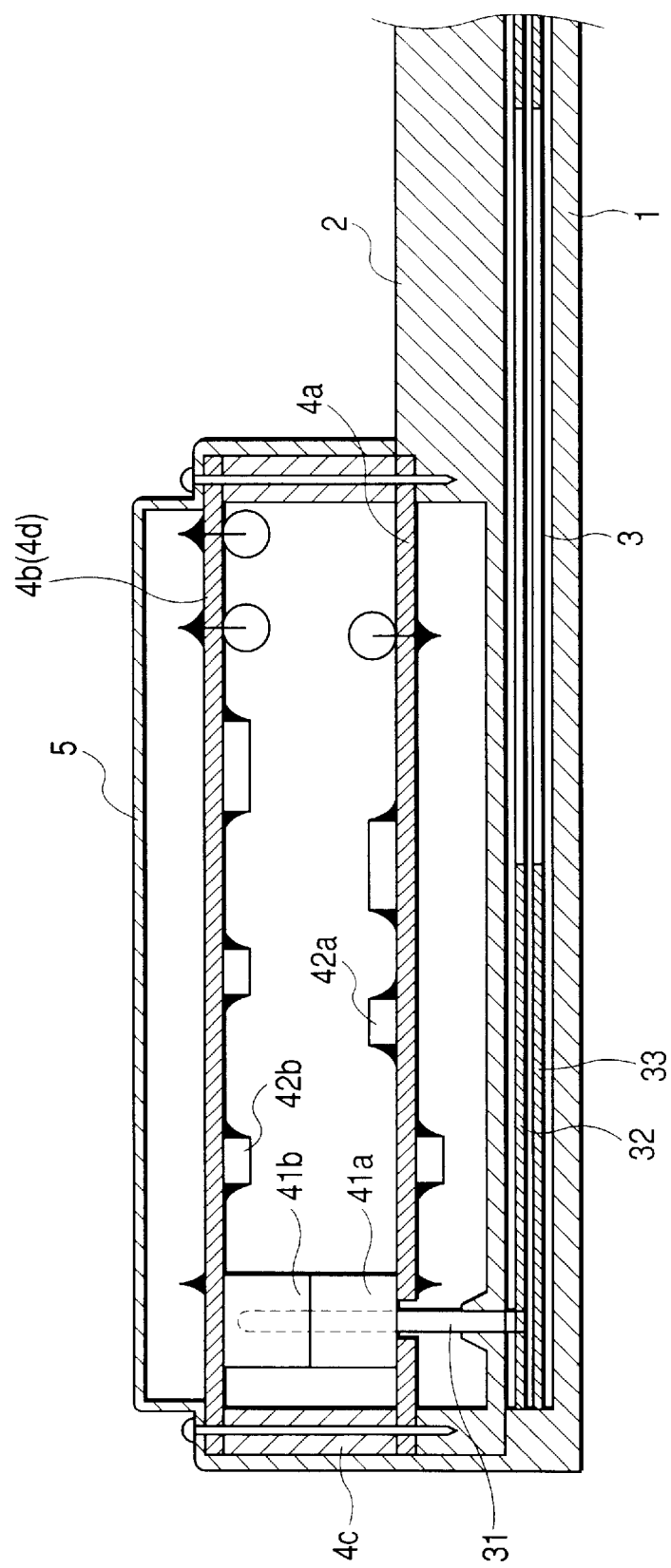
FIG. 10 is a cross-sectional view showing the electronic control unit mounting structure of the second embodiment in its assembled condition.
Figure 11:
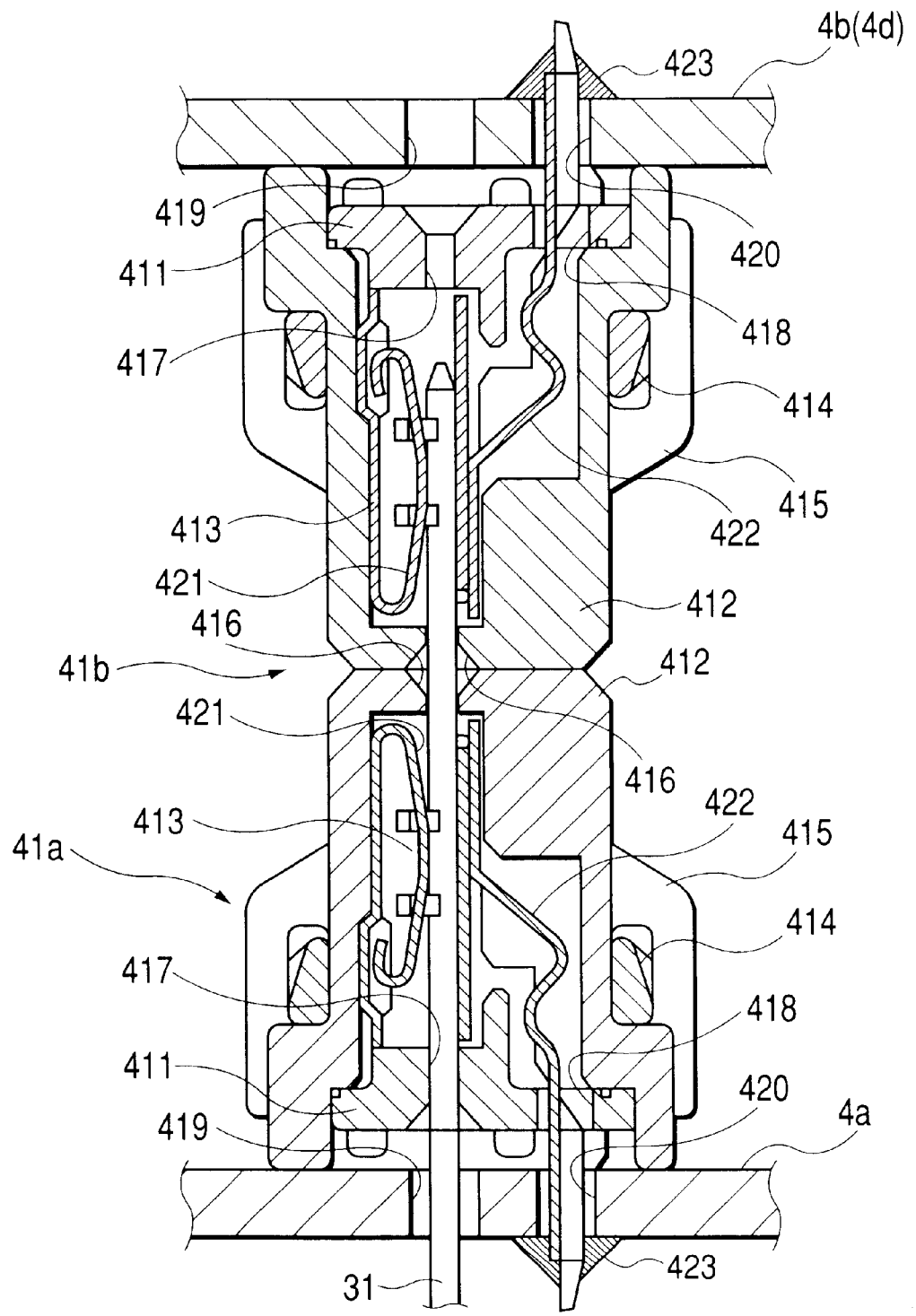
FIG. 11 is an enlarged, cross-sectional view of connector portions.

FIG. 9 is an exploded, perspective view of an electronic control unit mounting structure of a second embodiment, FIG. 10 is a cross-sectional view showing the electronic control unit mounting structure in its assembled condition, and FIG. 11 is an enlarged, cross-sectional view of connector portions of this structure.

As shown in FIG. 9, in the electronic control unit mounting structure of this second embodiment, a junction block and electronic control units are similar to those of the above-mentioned first embodiment.

Therefore, connectors 41a and 41b have a construction as shown in FIGS. 2 and 3. In this second embodiment, however, two printed circuit boards 4a and 4b are mounted on the junction block in such a manner that these boards 4a and 4b are superposed together, with their obverse surfaces facing respectively in directions reverse to each other. Therefore, the connector 41a is mounted on the upper surface of the printed circuit board 4a, serving as its obverse surface, while the connector 41b is mounted on the lower surface of the printed circuit board 4b serving as its obverse surface. Thus, the two connectors are symmetrical in an upward-downward direction.

As shown in FIG. 11, when the printed circuit board 4a is mounted, each tab terminal 31 extends through this printed circuit board 4a and the connector 41a, and at this time a spring tongue 421 contacts this tab terminal 31, and therefore a stacked bus bar 3 is electrically connected to a printed wiring of the printed circuit board 4a through the tab terminal 31, the spring tongue 421 and an extension piece portion 422 of a female metal member 413.

Then, when the printed circuit board 4b is mounted in superposed relation to the printed circuit board 4a, the tab terminal 31 is inserted into the connector 41b, and at this time a spring tongue 421 contacts this tab terminal 31, and therefore the stacked bus bar 3 is electrically connected to a printed wiring of the printed circuit board 4b through the tab terminal 31, the spring tongue 421 and an extension piece portion 422 of a female metal member 413. The thus assembled condition is shown in FIG. 10.

In this second embodiment, blocks of the printed circuit boards are the same as described above for the first embodiment, and the printed circuit board 4a serves as a door lock control unit, and the printed circuit board 4b serves as an alarm buzzer control unit. Therefore, the door lock control unit 4a is as shown in FIG. 6, and the alarm buzzer control unit is as shown in FIG. 7, and the arrangement of the terminals is as shown in FIG. 8.

As described above, the upstanding signal tab terminals 31 for connecting the printed circuit boards 4a and 4b together are provided on the junction block. The printed circuit board 4a is first inserted in a predetermined position, and then the printed circuit board 4b is mounted in such a manner that the same tab terminals 31 are inserted through the printed circuit board 4b in the same direction as described for the printed circuit board 4a. Here, the terminal arrangements of the printed circuit boards 4a and 4b are inverse to each other at the common signal portions, but the terminal arrangement can be easily changed in a pattern design of a printed circuit board, and therefore this will not be a large limitation from the viewpoint of the design.

As described above, in this second embodiment, even when the plurality of electronic control units are mounted, there is no need to provide a wire harness for connecting each electronic control unit to the junction block as in the first embodiment, and therefore the weight of the vehicle and the cost can be reduced. And besides, even when the plurality of electronic control units are mounted, the length of the terminals of the junction block are reduced since the two connectors face each other, and the production of the terminals is relatively easy. However, it is not always necessary to contact the two connectors with each other. Furthermore, the electronic control units can be easily kept in the predetermined posture relative to each other by spacers, and therefore the assemblage is simpler.

Third Embodiment

In an electronic control unit mounting structure of this third embodiment, a junction block and electronic control units are similar to those of the first embodiment (or the second embodiment).

This mounting structure is similar to that of FIG. 1 (or FIG. 9), and its cross-section in an assembled condition is similar to that of FIG. 4 (or FIG. 10). Here, at least one of the electronic control units can be selected from a plurality of prepared electronic control units. Here, printed circuit boards of the electronic control units, which can be selected, are designated by reference numerals 4b and 4d, respectively. When the printed circuit board 4b is selected, the structure is similar to the structures of the first and second embodiments, and when the printed circuit board 4d is selected, the structure differs from the structures of the first and second embodiments in that the printed circuit board 4d replaces the printed circuit board 4b.

The appearance and so on of connectors 41a and 41b are as shown in FIGS. 2 and 3. In this third embodiment, the connectors 41a and 41b are mounted on upper surfaces (obverse surfaces) of the printed circuit board 4a and 4b (see FIGS. 4 and 5), or the connector 41a is mounted on the upper surface (obverse surface) of the printed circuit board 4a while the connector 41b is mounted on the lower surface (obverse surface) of the printed circuit board 4b (see FIGS. 10 and 11). However, in either case, its basic structure is totally the same.

When the printed circuit board 4a is mounted, each tab terminal 31 extends through this printed circuit board 4a and the connector 41a, and at this time a spring tongue 421 contacts this tab terminal 31, and therefore a stacked bus bar 3 is electrically connected to a printed wiring of the printed circuit board 4a through the tab terminal 31, the spring tongue 421 and an extension piece portion 422 of a female metal member 413.

Then, when the printed circuit board 4b is mounted in superposed relation to the printed circuit board 4a, the tab terminal 31 is inserted into the connector 41b, and at this time a spring tongue 421 contacts this tab terminal 31, and therefore the stacked bus bar 3 is electrically connected to a printed wiring of the printed circuit board 4b through the tab terminal 31, the spring tongue 421 and an extension piece portion 422 of a female metal member 413. The thus assembled condition is shown in FIG. 4 (or FIG. 10).

Figure 12:
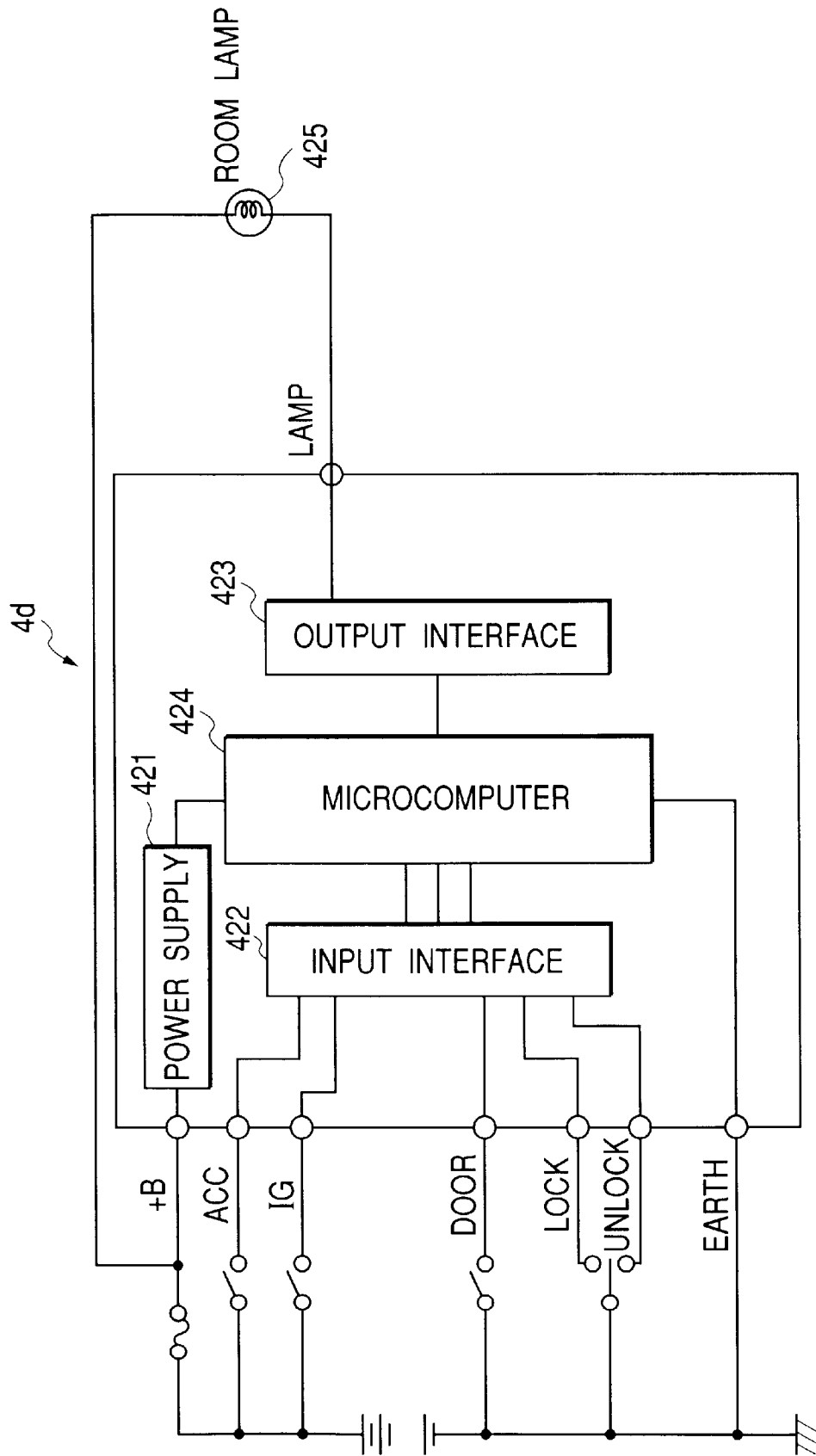
FIG. 12 is a block diagram of a printed circuit board of a room lamp control unit.
Figure 13:
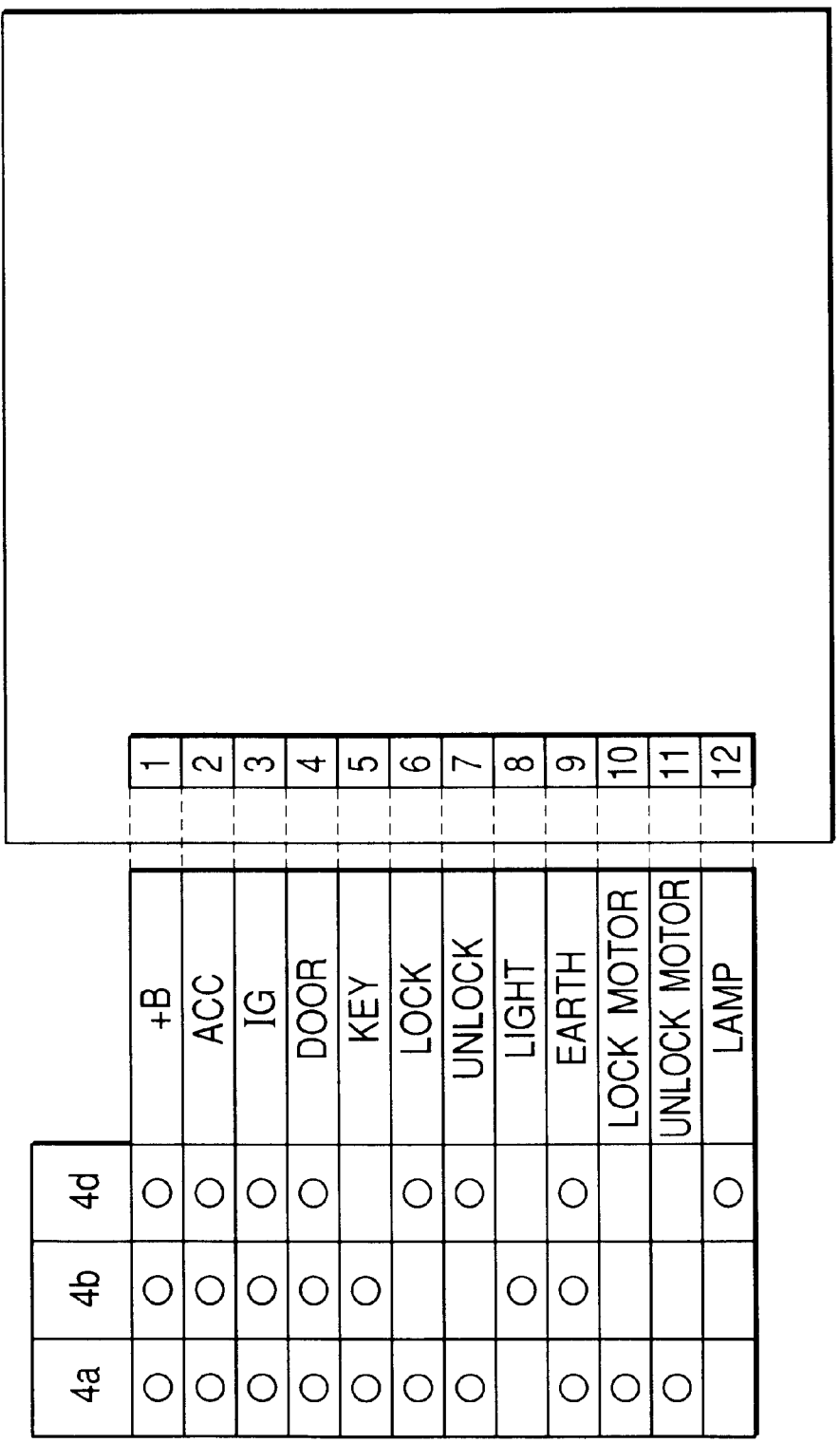
FIG. 13 is a diagram showing another example of a terminal arrangement.
Figure 14:
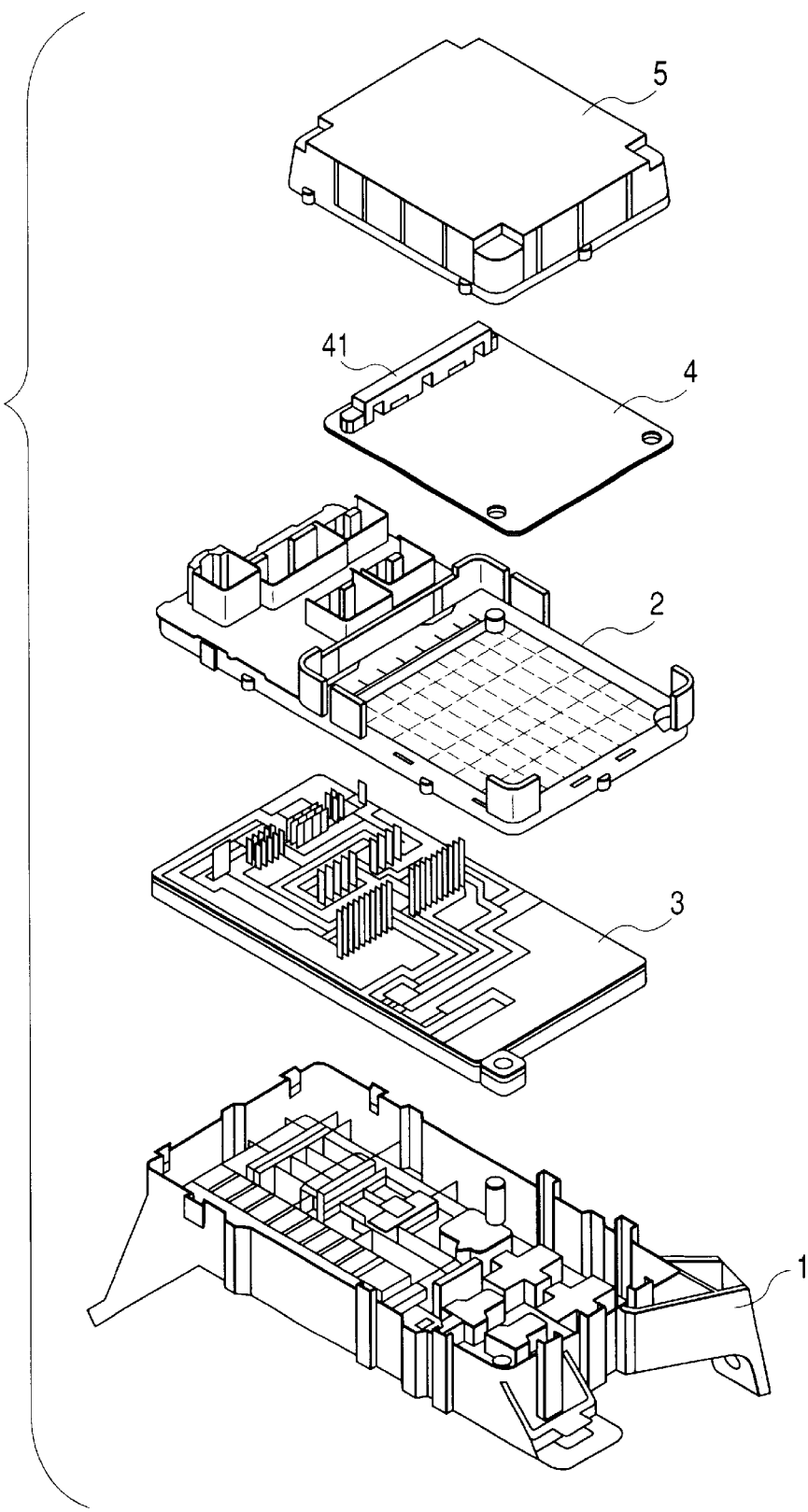
FIG. 14 is an exploded, perspective view of one conventional electronic control unit mounting structure.
Figure 15:
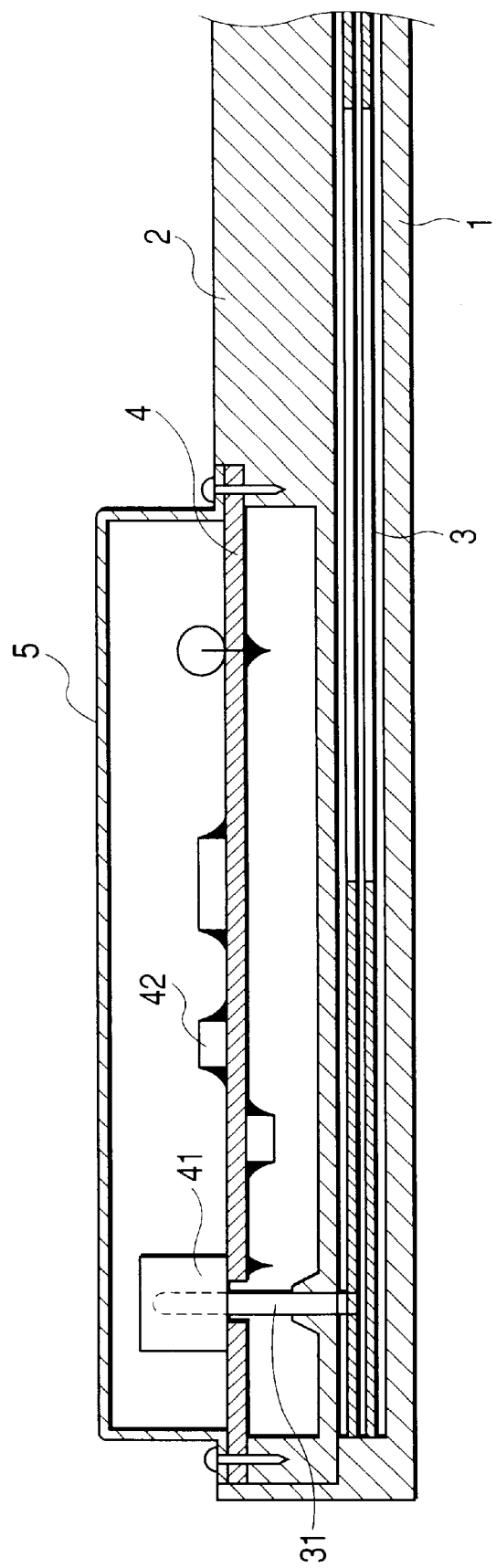
FIG. 15 is a cross-sectional view showing the conventional electronic control unit mounting structure in its assembled condition.

Description will be further made with reference to FIGS. 12, 13 and other Figures. FIG. 12 is a block diagram of another optional printed circuit board, and FIG. 13 is a diagram showing another example of a terminal arrangement. Here, the printed circuit board 4a, provided as a standard equipment, is a door lock control unit, and the optional printed circuit board 4b is an alarm buzzer control unit, and the other optional printed circuit board 4d is a room lamp control unit. These options are selected in accordance with the grade or the specification.

The standard door lock control unit 4a is as shown in FIG. 6, and the optional alarm buzzer control unit 4b is as shown in FIG. 7. As shown in FIG. 12, the optional room lamp control unit includes a power source portion 421 adapted to be connected to a battery (+B), an input interface 422, which is adapted to be connected to an accessory (ACC) of an ignition switch necessary for the control, an ON-signal (IG) of the ignition switch, a door switch (door) for detecting the opening/closing of a door, and a lock switch (lock) and an unlock switch (unlock) for respectively inputting door lock-locking and -unlocking signals, an output interface 423 adapted to be connected to a drive output (lamp) for driving a room lamp 425, and a microcomputer 424 connected to the above elements 421 to 423 and an earth.

Upstanding signal tab terminals 31 for connecting the printed circuit boards 4a and 4b (or 4d) together are provided on the junction block. The standard printed circuit board 4a is first inserted in a predetermined position, and then the optional printed circuit board 4b (or the other optional printed circuit board 4d) is mounted in such a manner that the same tab terminals 31 are inserted through the printed circuit board 4b (or 4d) in the same direction as described for the printed circuit board 4a. Here, the terminal arrangements of the two printed circuit boards 4a and 4b (or 4d) need to be the same at the common signal portions, but the terminal arrangement can be easily changed in a pattern design of a printed circuit board, and therefore this will not be a large limitation from the viewpoint of the design.

Reference numerals 1 to 12 on the printed circuit boards 4a, 4b and 4d in FIG. 13 denote plane positions in which the terminals can be provided, and the two boards 4a and 4b (or 4d) and the kinds of the terminals are shown in a matrix-like manner in left columns in such a manner that these correspond to the plane positions. Mark O in the matrix indicates the presence of the terminal on the boards 4a and 4b (or 4d), and the absence of this mark indicates the absence of the terminal. Therefore, if the stacked bus bar 3 is the signal circuit common to the printed circuit boards 4a and 4b (or 4d), the number of the tab terminals 31, as well as and the number of the female metal members 413 of the connectors 41a and 41b, is reduced, and the more efficient mounting can be achieved.

As described above, in this third embodiment, even when the plurality of electronic control units are mounted, there is no need to provide a wire harness for connecting each electronic control unit to the junction block as in the first and second embodiments, and therefore the weight of the vehicle and the cost can be reduced. And besides, the optional equipments can be easily provided in accordance with the selected grade and specification.

In the first to third embodiments, although the two printed circuit boards are used, three or more printed circuit boards can be used in a superposed manner.

In the first to third embodiments, although the spacers are interposed between the printed circuit boards, the use of the spacers can be omitted, depending on the type of structure of the printed circuit boards and the type of structure of the junction block. For example, there can be used a construction in which the printed circuit boards are formed into two different (large and small) plane sizes, and a board-receiving portion of the upper casing has a stepped construction, and the smaller printed circuit board is received in a lower portion of the stepped portion while the larger printed circuit board is received in an upper portion thereof.

Although the first to third embodiments are directed to the electronic control unit mounting structures used in the vehicle, the present invention can be applied to an electronic control unit mounting structure used in other fields, such for example as a household electric appliance.

As described above in detail, in the present invention, the plurality of electronic control units, each having the connector of the through construction mounted thereon, are superposed in such a posture that the connectors are disposed in registry with each other in the upward-downward direction, and in this condition the connection terminals of the junction block are inserted in the connectors. Therefore, even when the plurality of electronic control units are mounted, there is no need to provide a wire harness for connecting each electronic control unit to the junction block, and therefore the weight of the vehicle and the cost can be reduced.

In the invention, even when the plurality of electronic control units are mounted, each electronic control unit does not need to be changed in posture, and therefore the assemblage is simplified.

In the invention, even when the plurality of electronic control units are mounted, the length of the terminals of the junction block is reduced since the connectors of the adjacent electronic control units face each other, and therefore the production of the terminals is simplified.

In the invention, the electronic control units can be kept in the predetermined posture, and therefore the assemblage is simplified.

In the invention, the optional specification can be easily met with.

What is claimed is:

1. An electronic control unit mounting structure, wherein reconfigurable electronic control units are mounted on a junction block, said structure comprising:

said junction block, comprising upper and lower casings that exist independently as casings prior to assembly of said junction box, wiring members mounted between the lower and upper casings, and connection terminals extending from said wiring members through said upper casing;

a plurality of said electronic control units each having a connector of a through construction mounted thereon and being superposed in such a posture that said connectors are disposed in registry with each other in an upward-downward direction on top of said upper casing each said connector having at least one contact selectively provided therein; and the connection terminals of said junction block inserted in said connectors to selectively establish electric connection between respective ones of said connection terminals and said connectors by the at least one contact.

2. An electronic control unit mounting structure according to claim 1, wherein obverse surfaces of said electronic control units face in the same direction.

3. An electronic control unit mounting structure according to claim 1, wherein directions of obverse surfaces of the adjacent electronic control units are reverse to each other.

4. An electronic control unit mounting structure according to claim 1, wherein spacers are interposed between the adjacent electronic control units.

5. An electronic control unit mounting structure according to claim 1, wherein at least one of said electronic control units is selected from a plurality of prepared electronic control units.

6. An electronic control unit mounting structure, wherein reconfigurable electronic control units are mounted on a junction block, said structure comprising:

a plurality of said electronic control units each having a connector mounted thereon and being superposed in such a posture that said connectors are disposed in registry with each other in an upward-downward direction, each connector having a through hole and a female metal member selectively provided inside one of the through holes; and connection terminals of said junction block inserted through and contacting said female metal members.

7. An electronic control unit mounting structure according to claim 6, wherein obverse surfaces of said electronic control units face in the same direction.

8. An electronic control unit mounting structure according to claim 6, wherein directions of obverse surfaces of the adjacent electronic control units are reverse to each other.

9. An electronic control unit mounting structure according to claim 6, wherein spacers are interposed between the adjacent electronic control units.

10. An electronic control unit mounting structure according to claim 6, wherein at least one of said electronic control units is selected from a plurality of prepared electronic control units.

11. An electronic control unit mounting structure according to claim 6, wherein the female metal member includes a resilient tongue.

12. An electronic control unit mounting structure, wherein reconfigurable electronic control units are mounted on a junction block, said structure comprising:

a plurality of said electronic control units each having a connector of a through construction mounted thereon and being superposed in such a posture that said connectors are disposed in registry with each other in an upward-downward direction, each said connector having at least one contact selectively provided therein; and connection terminals extending from said junction block, the connection terminals inserted in said connectors to selectively establish electric connection between respective ones of said connection terminals and said connectors by the at least one contact, each connection terminal passing through more than one of said connectors that are disposed in registry with each other.

13. An electronic control unit mounting structure according to claim 12, wherein obverse surfaces of said electronic control units face in the same direction.

14. An electronic control unit mounting structure according to claim 12, wherein directions of obverse surfaces of the adjacent electronic control units are reverse to each other.

15. An electronic control unit mounting structure according to claim 12, wherein spacers are interposed between the adjacent electronic control units.

16. An electronic control unit mounting structure according to claim 12, wherein at least one of said electronic control units is selected from a plurality of prepared electronic control units.

17. An electronic control unit mounting structure, wherein reconfigurable electronic control units are mounted on a junction block, said structure comprising:

a plurality of said electronic control units each having a connector of a through construction mounted thereon and being superposed in such a posture that said connectors are disposed in registry with each other in an upward-downward direction, each said connector having at least one contact selectively provided therein; and connection terminals of said junction block inserted in said connectors to selectively establish electric connection between respective ones of said connection terminals and said connectors by the at least one contact, wherein spacers are interposed between the adjacent electronic control units.

* * * * *